United States Patent [19]

Yang et al.

[11] Patent Number: 5,363,390

[45] Date of Patent: Nov. 8, 1994

[54] SEMICONDUCTOR LASER THAT GENERATES SECOND HARMONIC LIGHT BY MEANS OF A NONLINEAR CRYSTAL IN THE LASER CAVITY

[75] Inventors: Long Yang, Union City; Rajeev Ram, Santa Barbara, both of Calif.

[73] Assignee: Hewlett-Packard Company, Palo Alto, Calif.

[21] Appl. No.: 156,216

[22] Filed: Nov. 22, 1993

[51] Int. Cl.$^5$ ............................................. H01S 3/10
[52] U.S. Cl. .................................. 372/22; 372/21; 372/99; 372/45; 372/92
[58] Field of Search ................. 372/22, 98, 21, 99, 372/45, 92

[56] References Cited

U.S. PATENT DOCUMENTS

| | | | |
|---|---|---|---|
| 5,070,505 | 12/1991 | Dixon | 372/22 |
| 5,231,642 | 7/1993 | Scifres et al. | 372/99 |
| 5,249,195 | 9/1993 | Feldman et al. | 372/99 |
| 5,317,447 | 5/1994 | Baird et al. | 372/22 |

OTHER PUBLICATIONS

M. J. Angell et al., "Orientation Patterning of II–VI Semiconductor Films for Quasi-phasematched Nonlinear Devices", Optical Society of America, 1992 Technical Digest Series, vol. 10, Mar. 22–24, 1993, Palm Springs, California.

R. J. Ram, et al., "analysis of Wafer Fusing of 1.3um Vertical Cavity Surface Emitting Lasers", Appl. Phys. Lett. 62(20), 17 May 1993, pp. 2474–2476.

D. Vakhshoori et al., "Blue-Green Surface-Emitting Second Harmonic Generators on (111)B GaAs", Appl. Phys. Lett. 59(8), 19 Aug. 1991, pp. 896–898.

M. A. Haase et al., "Blue-Green Laser Diodes", Appl. Phys. Lett. 59(11), 9 Sep. 1991, pp. 1272–1274.

J. J. Dudley et al., "Low Threshold, electrically Injected InGaAsP (1.3 um) Vertical Cavity Lasers on GaAs Substrates", 51st Annual Device Research Conference, June. 21–23, 1993, University of California, Santa Barbara, California, IEEE Electron Devices Society.

R. J. Raml et al., "Characterization of Wafer Fusing for Hybrid Optoelectronic Devices", 1993 Electronic Materials Conference, University of California, Santa Barbara, California, Jun 23–25, 1993, p. A47.

Primary Examiner—Leon Scott, Jr.

[57] ABSTRACT

A surface-emitting laser with an integral nonlinear crystal. The laser generates light at a fundamental frequency. The nonlinear crystal converts the light into light at twice the fundamental frequency. The laser is configured in a vertical-cavity, surface-emitting structure. An adhesive layer containing indium such as indium gallium phosphide is disposed between a phosphide nonlinear crystal and an arsenide optical amplifier. The optical amplifier and the nonlinear crystal are fused together. The optical amplifier and the nonlinear crystal are located inside a laser cavity that is defined between a pair of reflectors. One of the reflectors is located adjacent the nonlinear crystal and is highly reflective of light at the fundamental frequency but transmissive of light at twice the fundamental frequency. Light is generated at the fundamental frequency, doubled in frequency as it passes back and forth through the nonlinear crystal, and emitted through the reflector adjacent the nonlinear crystal. An intracavity reflector may be included between the optical amplifier and the nonlinear crystal to prevent light at twice the fundamental frequency from propagating from the nonlinear crystal into the optical amplifier.

19 Claims, 2 Drawing Sheets

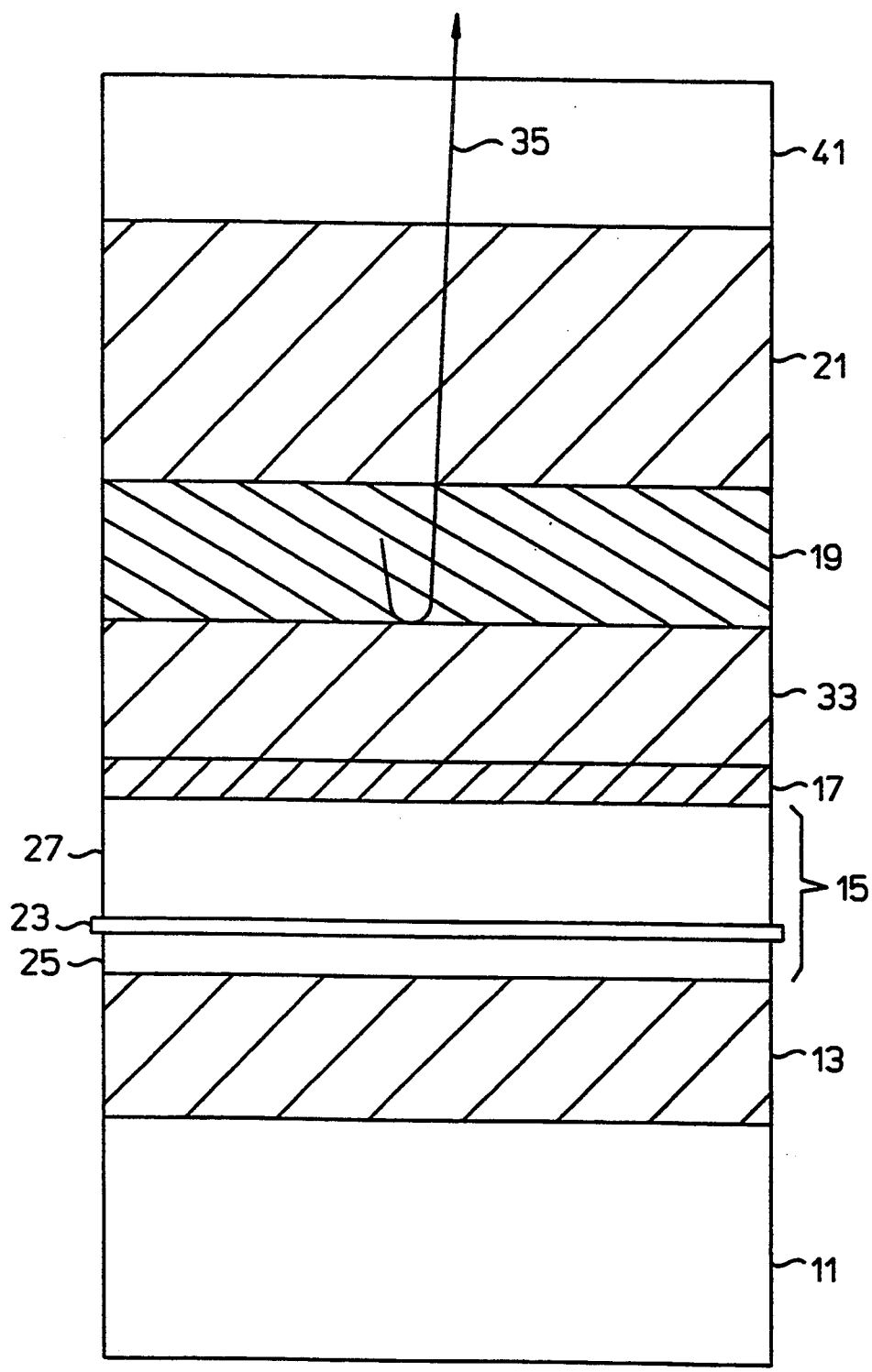

SEMICONDUCTOR LASER THAT GENERATES SECOND HARMONIC LIGHT BY MEANS OF A NONLINEAR CRYSTAL IN THE LASER CAVITY

FIELD OF THE INVENTION

The present invention relates generally to lasers and more particularly to a semiconductor laser that generates second harmonic light by means of a nonlinear crystal attached to a semiconductor optical amplifier in the laser cavity.

BACKGROUND OF THE INVENTION

There has been a need for an inexpensive, compact source of blue light for use in applications as diverse as flat displays for computers and entertainment systems, medical devices, analytical instruments, data storage, and optical communications. A semiconductor laser that could produce blue light would meet these requirements of low cost and small size. Semiconductor lasers have been used successfully to generate relative long-wavelength light such as green light (about 5,200 Å), red light (about 6,500 Å), or infrared (7,000 Å to over 100,000 Å). However, blue light has a relatively short wavelength (about 4,700 Angstroms) and lasers made of semiconductor materials have not given satisfactory results at such short wavelengths.

Some kinds of light-emitting diodes ("LEDs") are capable of emitting blue light. However, LEDs can only emit light over a relatively broad spectrum and therefore are not suitable for applications that require a single wavelength or a narrow range of wavelengths. In addition, the output power of LEDs is too low for many applications. Lasers can generate light at a single wavelength, but most lasers, especially semiconductor lasers, have not been able to generate light with a wavelength as short as that of blue light. For example, lasers fabricated of group III-V semiconductor compounds (usually compounds of gallium, indium or aluminum with arsenic or phosphorus such as AlGaAs or AlGaInP) do not produce significant energy—at room temperature—at wavelengths shorter than about 5,500 Å. Other semiconductor light sources are very weak (e.g. silicon carbide), have a very short lifetime (e.g. polymers) or are too soft to work with easily and are not sufficiently reliable as yet (e.g. group II-VI compounds).

A semiconductor laser that can produce blue light was first reported by Hasse et al. in *Applied Physics Letters*, vol. 59, page 1272 (1991). This device is fabricated of a zinc-cadmium-sulfur-selenium compound and works at an extremely low temperature of 77° K. (−196° C.), not at room temperature. Continuous wave ("CW") devices that work at room temperature with reasonable lifetimes have not been reported.

Another approach to generating coherent short-wavelength light is through a second harmonic generation process in a nonlinear optical material. The second harmonic is twice the frequency, and hence half the wavelength, of the fundamental. For example, infrared light with a fundamental wavelength of 9,400 Å has a second harmonic with a wavelength of 4,700 Å. The intensity of the second harmonic is in general proportional to the square of the intensity of the fundamental, and if the available fundamental intensity is sufficient a strong second harmonic can be obtained. This approach has been used successfully with continuous-wave solid state lasers such as Nd:YAG. However, laser systems according to this approach have utilized multiple components and therefore have been physically bulky and expensive and have required very precise alignment. In addition, difficulties with stability and control have been encountered. Laser systems of this kind are described in such references as Yariv, *Introduction to Optical Electronics* (4th Ed.), Holt, Rinehart & Wilson, 1991; Yamamoto et al., *IEEE Journal of Quantum Electronics*, Vol. 28, page 1909 (1992); and Tamada et al., *Proceedings of OSA Compact Blue-Green Lasers Topical Meeting*, Santa Fe, N.M., page 120 (1992).

It is known to fabricate a monolithic device with a second harmonic generating element of a similar semiconductor material inside the cavity of a gallium arsenide or aluminum gallium arsenide edge-emitting semiconductor laser. However, these devices have long cavities which result in large absorption losses and phase matching difficulties. These disadvantages have made it impractical to generate useful second harmonic outputs with the desired wavelengths. Lasers of this kind are described in such references as Ogasawara et al., "Second Harmonic Generation in an AlGaAs Double-Heterostructure Laser, *Japanese Journal of Applied Physics*, Vol. 26, page 1386 (1987).

Monolithic surface-emitting devices having nonlinear regions have also been proposed. One such device, described by Vakhshoori et al., *Applied Physics Letters*, Vol. 59, page 896 (1991), has relatively low output power for the same reasons as the edge-emitting device. Moreover, the emitted light is distributed over a wide angular and spatial range and therefore is difficult to condense.

A more promising approach is described in copending U.S. patent application Ser. No. 08/047,969, filed Apr. 15, 1993 and assigned to the same assignee as the present application. This approach utilizes a vertical-cavity surface-emitting laser ("SEL"). The SEL is made of group III-V semiconductor material and is particularly fabricated to utilize certain nonlinear optical characteristics of the III-V material itself for frequency doubling purposes. This approach takes advantage of the relatively high intensity of light that is present inside the active region of an SEL. However, this approach requires a non-standard substrate orientation which may be difficult to manufacture, and the output power is limited by absorption of the frequency-doubled light in the semiconductor material.

Another approach is described in that certain U.S. patent application titled "Semiconductor Laser That Generates Second Harmonic Light With Attached Nonlinear Crystal" by Fouquet and Yamada, filed the same date as the within application and assigned to the same assignee as the within application, the contents of which are incorporated herein by reference.

Previous attempts to fabricate an SEL with an integral frequency doubling element have been constrained by a limited selection of suitable materials from which to fabricate a nonlinear crystal. The choices have been limited to materials having a crystal structure identical with that of gallium arsenide. It has been suggested that this limitation may be overcome by using wafer-bonding techniques to integrate a nonlinear crystal into a gallium arsenide SEL. This would permit the use of materials that have high nonlinear susceptibilities and low optical losses both at the fundamental frequency of the SEL and at the frequency-doubled second harmonic output.

Both reflectors in a practical SEL must have extremely high reflectivities. In addition, the SEL must be characterized by low optical losses, low parasitic resistance, and high thermal conductivity for heatsinking purposes. Many nonlinear dielectrics, among them LiNbO$_3$, are not electrically conductive; this makes electrical injection difficult. In addition, one of the steps of fabricating the laser cavity is depositing one of the reflectors on the nonlinear crystal. This can be done by using dielectric distributed Bragg reflectors such as SiO$_2$ or TiO$_2$. However, these materials do not have a high enough thermal conductivity to provide adequate heat sinking. In addition, for long-term reliability it is necessary that the substrate, the nonlinear crystal and the reflectors all have similar thermal coefficients of expansion; this is not the case if materials such as those mentioned above are used.

It will be apparent from the foregoing that there is still a need for a compact, efficient semiconductor laser that can generate blue light.

SUMMARY OF THE INVENTION

The present invention provides a semiconductor laser having a gallium phosphide nonlinear crystal fused to a gallium arsenide optical amplifier. Low frequency light (typically red or infrared) is generated in the laser and is doubled in frequency by the nonlinear crystal. The frequency-doubled light (typically blue, green or ultraviolet) is emitted. The laser is compact, stable, efficient and easy to manufacture.

Briefly and in general terms, a laser according to the invention includes a first reflector on a gallium arsenide substrate and an optical amplifier on the first reflector. A nonlinear crystal is fused ("fused" is also referred to as "wafer bonded") to the optical amplifier through an adhesive layer. A second reflector is located on the nonlinear crystal. The first and second reflectors define a laser cavity that extends through the optical amplifier, the adhesive layer and the nonlinear crystal.

Both reflectors are preferably over 90% reflective of light at a desired fundamental frequency, typically red or infrared light. The second reflector is preferably at least 50% transmissive of light at twice the fundamental frequency. The laser, when powered by an external energy source, generates light in the laser cavity at the fundamental frequency. The nonlinear cystal converts the fundamental-frequency light into frequency-doubled light, typically blue, green or ultraviolet. The frequency-doubled light is emitted through the second reflector.

Various materials may be used to fabricate the components of the laser. In a preferred embodiment the optical amplifier consists of an active region of indium gallium arsenide between a pair of spacer layers of gallium arsenide. In this embodiment the first reflector is made of aluminum gallium arsenide; the nonlinear crystal and the second reflector are made of aluminum gallium phosphide; and the adhesive layer comprises indium, preferably indium gallium phosphide. The adhesive layer is lattice-matched to the crystal structure of the optical amplifier.

An intracavity reflector is preferably included between the adhesive layer and the nonlinear crystal. This intracavity reflector is typically made of aluminum gallium phosphide. The intracavity reflector is transmissive of light at the fundamental frequency but reflective of light at twice the fundamental frequency; it serves to reflect as much frequency-doubled light as possible from the nonlinear crystal toward the output. It may also be designed to be antireflective at the fundamental frequency to minimize any losses of fundamental-frequency light passing between the optical amplifier and the nonlinear crystal.

A method of making a semiconductor laser according to the princples of the invention includes the following steps:

forming a first structure by epitaxially growing a first reflector on a gallium arsenide substrate, an optical amplifier on the first reflector, and an adhesive layer on the optical amplifier;

forming a second structure by epitaxially growing a second reflector on a gallium phosphide substrate, a nonlinear crystal on the second reflector and, optionally, an intracavity reflector on the nonlinear crystal; and pressing the nonlinear crystal (or the intracavity reflector, if one is used) against the adhesive layer and raising the temperature to fuse the two structures together.

After the two structures have been fused together, the gallium phosphide substrate is removed so that frequency-doubled light can be emitted through the second reflector.

Other aspects and advantages of the invention will become apparent from the following detailed description, taken in conjunction with the accompanying drawings, illustrating by way of example the principles of the invention.

BRIEF DESCRIPTION OF THE DRAWINGS

FIG. 2 is a cross-sectional view of an embodiment similar to that shown in FIG. 1 and also including an intracavity reflector between the optical amplifier and the nonlinear crystal.

DESCRIPTION OF THE PREFERRED EMBODIMENT

Figure 1:
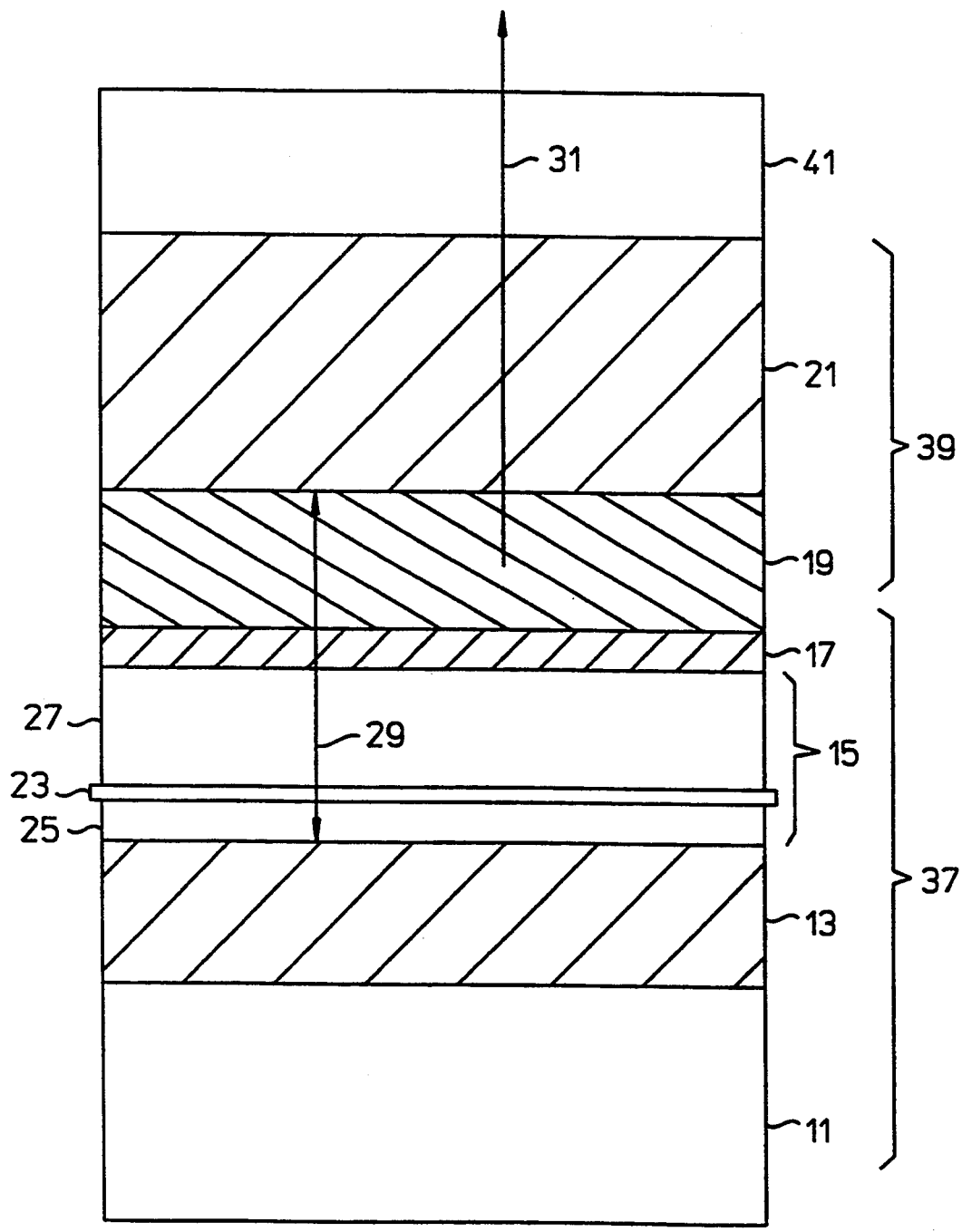
FIG. 1 is a cross-sectional view of a vertical-cavity surface-emitting laser embodying the principles of the invention.

As shown in the drawings for purposes of illustration, the invention is embodied in a surface-emitting laser having a phosphide nonlinear crystal fused to an arsenide optical amplifier in the laser cavity. The laser generates infrared or other relatively low-frequency light. The nonlinear crystal converts the low-frequency light to light having twice the frequency to provide blue or other relatively high-frequency light. There has been a need for a reliable, economical and compact laser that can provide blue light, but existing approaches have not been satisfactory.

A laser that embodies the principles of the invention can be manufactured easily and economically. The laser provides a compact, stable source of blue light. Internal absorption of the blue light may be minimized by fabricating the nonlinear crystal of a material characterized by low absorption at blue light frequencies.

A preferred embodiment of a surface-emitting semiconductor laser according to the invention is shown in cross-sectional view in FIG. 1. The laser includes a gallium arsenide substrate 11, a first reflector 13 adjacent the substrate 11, an optical amplifier 15 adjacent the first reflector 13, an adhesive layer 17 adjacent the optical amplifier 15, a nonlinear crystal 19 fused to the optical amplifier 15 through the adhesive layer 17, and a second reflector 21 adjacent the nonlinear crystal 19.

The first reflector 13, which is highly reflective of light at a desired fundamental frequency, comprises an arsenide such as gallium arsenide or aluminum gallium arsenide. The optical amplifier 15 also comprises an arsenide. In the embodiments shown in the drawings, the optical amplifier 15 includes an active region of indium gallium arsenide 23 between a pair of spacer layers 25 and 27 of gallium arsenide, but it will be apparent that other materials could also be used. For example, the amplifier may comprise AlGaAs and the spacers may comprise InGaP or AlInGaP.

The second reflector 21, which is highly reflective of light at the fundamental frequency and transmissive of light at twice the fundamental frequency, comprises a phosphide such as aluminum phosphide or aluminum gallium phosphide. The nonlinear crystal 19 also comprises a phosphide, typically aluminum gallium phosphide.

The adhesive layer preferably comprises indium. In a preferred embodiment the adhesive layer is grown of indium gallium phosphide with a crystal lattice structure matching that of the underlying arsenides.

The first and second reflectors 13 and 21 define therebetween a laser cavity that extends from the first reflector 13 through the optical amplifier 15, the adhesive layer 17 and the nonlinear crystal 19 to the second reflector 21.

In operation, the laser is responsive to an external energy source (not shown) to generate light in the laser cavity at the fundamental frequency. The light travels back and forth through the cavity as indicated by an arrow 29. The nonlinear cystal 19 converts some of this light to light having twice the fundamental frequency. The frequency-doubled light is emitted through the second reflector 21 as indicated by an arrow 31 to provide a beam of frequency-doubled light.

A second preferred embodiment is shown in FIG. 2. This embodiment includes an intracavity reflector 33 but in other respects is generally similar to the embodiment shown in FIG. 1. For convenience, elements of the second embodiment that are similar to elements of the first embodiment have the same reference numerals.

The intracavity reflector 33 is located between the optical amplifier 15 and the nonlinear crystal 19. The intracavity reflector 33 comprises a phosphide such as aluminum phosphide or aluminum gallium phosphide that is transmissive of light at the fundamental frequency and reflective of light at twice the fundamental frequency. Preferably the intracavity reflector 33 is disposed between the adhesive layer 17 and the nonlinear crystal 19.

In operation, the intracavity reflector 33 serves to reflect any frequency-doubled light away from the optical amplifier 15 and toward the second reflector 21, as shown by an arrow 35. In addition, the intracavity reflector 33 may also serve as an antireflective region at the fundamental frequency, thereby minimizing any losses in fundamental-frequency light traveling between the optical amplifier 15 and the nonlinear crystal 19.

The laser is typically energized by an electric current from a power supply (not shown). The current is applied to the laser through electrical contacts (not shown) in any convenient configuration of the kind customarily used in conventional surface-emitting lasers.

A method of making a semiconductor laser according to the invention comprises the steps of forming a first structure generally 37, forming a second structure generally 39, and fusing the structures together. More particularly, with reference to the elements as discussed above and illustrated in FIG. 1, the first structure 37 is formed by epitaxially growing the first reflector 13 on the substrate 11, epitaxially growing the optical amplifier 15 on the first reflector 13, and epitaxially growing the adhesive layer 19 on the optical amplifier 15. The second structure 39 is formed by epitaxially growing the second reflector 21 on a gallium phosphide substrate 41 and epitaxially growing the nonlinear crystal 19 on the second reflector 21. The structures are then fused by pressing the nonlinear crystal 19 against the adhesive layer 17 and raising the temperature to fuse the two structures together.

Any of a range of fusing pressures and temperatures may be used as desired. Provided the lattice-matching layer contains indium, uniform bonding can be obtained at a fusing temperature of less than 950° Celsius.

After the two structures 37 and 39 have been fused together, the gallium phosphide substrate 41 is removed to expose the second reflector 21 so that the frequency-doubled light from the nonlinear crystal 19 can be emitted as shown by the arrow 31. Of course, if the substrate 41 is transmissive of light at the doubled frequency, there is no need for removal.

The gallium arsenide substrate 11 has an orientation (100). Because of crystal symmetry of zincblende structure, the most efficient orientation for second harmonic generation is <111>. The crystal growth can be made easier by choosing an orientation such as (311) or (110) of the gallium phosphide substrate 41 for which the epitaxy of the nonlinear crystal 19 and second reflector 21 is easiest.

If an intracavity reflector is desired, it is epitaxially grown on the nonlinear crystal prior to the step of fusing the two structures 37 and 39. The structures are then fused by pressing the intracavity reflector against the lattice-matching layer and increasing the temperature.

The physical dimensions of the various components are conventional and will be apparent to those with skill in the art. The nonlinear crystal is preferably between about one micrometer and one millimeter thick. If the power output of the laser at the fundamental frequency is sufficiently high, the nonlinear crystal may be thinner than one coherence length, thereby eliminating any need for phase matching. Otherwise, phase matching can be satisfied by growing alternating AlGaP and GaP layers. Non-critical phase matching is preferred in order to reduce temperature sensitivity and obtain greater angular tolerance. Actual phase matching strategy will be determined by the refractive index and nonlinearity characteristics of the nonlinear crystal.

In the fusing process, two clean materials (the adhesive layer and the nonlinear crystal) are put together in the orientation desired for the final structure. A good strategy for cleaning these materials is to prepare them as if another semiconductor were to be subsequently grown on them; they should be degreased and oxides should be removed.

Static pressure is then applied in a direction perpendicular to the interface between the materials. It is preferable to apply a relatively even pressure across this interface. The pressure should be applied by a device which can tolerate the temperature required for fusion, for example a graphite press. In order to control and reproduce the pressure, a torque wrench can be used to tighten the press; other methods are also possible. The samples, now compressed, are heated to a high enough temperature for fusion to take place. As discussed above, a temperature of less than 950° C. can be used if the adhesive layer includes indium.

The pressure will change somewhat compared to the pressure applied at room temperature due to the difference in thermal expansion between the samples and the press. Appropriate methods may be used to maintain a constant pressure regardless of temperature.

It is preferable to carry out the heating in a controlled atmosphere. Good conditions for fusing have been found to be a pressure of about 300 grams per square centimeter, a temperature of 650° Celsius, a time of 30 minutes, and a hydrogen gas ambient. See, for example, R. J. Ram, J. J. Dudley, L. Yang, K. Nauka, J. Fouquet, M. Ludowise, Y. M. Houng, D. E. Mars and S. Y. Wang, "Characterization of Wafer Fusing for Hybrid Optoelectronic Devices," *Electronic Materials Conference*, Santa Barbara, Calif., Jun. 23–25, 1993.

Optimal conditions will depend on the particular materials used. For example, if too much phosphorus evaporates from a phosphorus-containing crystal before the fusion is complete, phosphine gas can be added to the hydrogen ambient to maintain a proper phosphorus-containing crystal structure.

Considerations respecting the choice of materials will now be discussed.

Phosphides such as GaP and AlP are used for the nonlinear crystal and the second reflector because the nonlinear susceptibilities of GaP and AlP are similar to that of GaAs and because optical losses of GaP and AlP are much lower than those of GaAs and AlAs. Further reduction of optical loss can be attained by using AlGaP; AlGaP is lattice matched to GaP and has a larger bandgap than GaP.

The thermal coefficients of expansion of GaP and AlP are similar to the coefficient of expansion of GaAs. The thermal conductivities of GaP and AlP are much higher than that of GaAs. GaP and AlP can be doped to either p-type or n-type to achieve good electrical conductivity.

AlGaP and AlP have large optical refractive index differences. This makes it possible to realize a reflector structure with relatively few layers.

Various parameters of the above-mentioned materials may be compared with parameters of other materials by reference to the following table:

|  | GaP | AlP | GaAs | AlAs | ZnS | LiNbO$_3$ |
|---|---|---|---|---|---|---|
| Lattice constant, Å | 5.451 | 5.451 | 5.653 | 5.661 | 5.42 | 5.148/13.863 |
| Bandgap, eV | 2.24 | 2.5 | 1.42 | 2.16 | 3.68 | N/A |
| Thermal expansion, $10^{-6}$/°K. | 5.3 | — | 4.6 | 5.4 | 3.5 | 15.4/7.5 |
| Thermal conductivity, mW/cm-°K. |  | 752 | 920 | 560 | 840 | 251 56 |
| Index ($\lambda$ = 1.0 $\mu$m) | 3.1 | 2.8 | 3.51 | 2.95 | 2.3 | 2.16/2.16 |
| Index ($\lambda$ = 0.5 $\mu$m) | 3.5 | 2.9 | 4.31 | 3.4 | 2.42 | 2.34/2.25 |
| Optical loss ($\lambda$ = 0.5 $\mu$m), cm$^{-1}$ | 617 | <600 | 10,000 | 313 | 1 | <1 |
| Nonlinear coefficient, relative units | 80 | — | 72 | — | 13 | 4.4 |

TABLE I: SUMMARY OF MATERIAL PARAMETERS

From the foregoing it will be appreciated that the laser provided by the invention meets the need for an economical source of coherent light at shorter wavelengths than have heretofore been attained. The laser is easy to manufacture using conventional techniques, and it operates efficiently to provide light at green to ultraviolet wavelengths and beyond.

Although specific embodiments of the invention have been described and illustrated, the invention is not to be limited to the specific forms or arrangements of parts so described and illustrated, and various modifications and changes can be made without departing from the scope and spirit of the invention. Within the scope of the appended claims, therefore, the invention may be practiced otherwise than as specifically described and illustrated.

We claim:

1. A semiconductor laser comprising:
   a gallium arsenide substrate;
   a first reflector adjacent the substrate, the first reflector comprising an arsenide, the first reflector reflective of light at a desired fundamental frequency;
   an optical amplifier adjacent the first reflector, the optical amplifier comprising an arsenide;
   an adhesive layer adjacent the optical amplifier;
   a nonlinear crystal fused to the optical amplifier through the adhesive layer, the nonlinear crystal comprising a phosphide; and
   a second reflector adjacent the nonlinear crystal, the second reflector comprising a phosphide, the second reflector reflective of light at said fundamental frequency and transmissive of light at twice the fundamental frequency, the first and second reflectors defining therebetween a laser cavity that extends from the first reflector through the optical amplifier, the adhesive layer and the nonlinear crystal to the second reflector,
   the laser responsive to an external energy source to generate light in the laser cavity at the fundamental frequency, the nonlinear cystal operative to convert the generated light into light having a frequency double the frequency of the generated light and thereby provide a beam of frequency-doubled light through the second reflector.

2. A laser as in claim 1 wherein the optical amplifier comprises an active region fabricated of at least one of the group comprising indium and aluminum.

3. A laser as in claim 1 wherein the first reflector comprises aluminum gallium arsenide.

4. A laser as in claim 1 wherein the second reflector comprises aluminum gallium phosphide.

5. A laser as in claim 1 wherein the adhesive layer comprises indium.

6. A laser as in claim 5 wherein the adhesive layer comprises indium gallium phosphide.

7. A laser as in claim 1 wherein the nonlinear crystal comprises aluminum gallium phosphide.

8. A laser as in claim 1 and further comprising an intracavity reflector between the optical amplifier and the nonlinear crystal, the intracavity reflector comprising a phosphide, the intracavity reflector transmissive of light at the fundamental frequency and reflective of light at twice the fundamental frequency.

9. A laser as in claim 8 wherein the intracavity reflector is disposed between the adhesive layer and the nonlinear crystal.

10. A laser as in claim 9 wherein the intracavity reflector comprises aluminum gallium phosphide.

11. A method of making a semiconductor laser, the method comprising:

forming a first structure by (a) epitaxially growing an arsenide on a gallium arsenide substrate to form a first reflector that is reflective of light at a desired fundamental frequency, (b) epitaxially growing an arsenide on the first reflector to form an optical amplifier, and (c) epitaxially growing a phosphide on the optical amplifier to form an adhesive layer that is lattice-matched to the crystal structure of the optical amplifier;

forming a second structure by (a) epitaxially growing a phosphide on a gallium phosphide substrate to form a second reflector that is reflective of light at said fundamental frequency and transmissive of light at twice the fundamental frequency, and (b) epitaxially growing a phosphide on the second reflector to form a nonlinear crystal;

pressing the nonlinear crystal against the adhesive layer; and fusing the two structures together by raising the temperature.

12. A method as in claim 11 and further comprising, after fusing the two structures together, removing the gallium phosphide substrate from the second reflector.

13. A method as in claim 11 wherein the step of forming a second structure further comprises the step of epitaxially growing a phosphide on the nonlinear crystal to form an intracavity reflector that is transmissive of light at the fundamental frequency and reflective of light at twice the fundamental frequency.

14. A method as in claim 11 wherein the step of epitaxially growing an optical amplifier comprises the substeps of growing a first spacer layer of gallium arsenide, growing an active layer of indium gallium arsenide, and growing a second spacer layer of gallium arsenide.

15. A method as in claim 11 wherein the first reflector comprises aluminum gallium arsenide.

16. A method as in claim 11 wherein the second reflector comprises aluminum gallium phosphide.

17. A method as in claim 11 wherein the nonlinear crystal comprises aluminum gallium phosphide.

18. A method as in claim 11 wherein the adhesive layer comprises indium.

19. A method as in claim 18 wherein the adhesive layer comprises indium gallium phosphide.

* * * * *